United States Patent [19]

Nishioka et al.

[11] Patent Number: 4,490,838
[45] Date of Patent: Dec. 25, 1984

[54] MUTING CIRCUIT FOR AM STEREOPHONIC RECEIVER

[75] Inventors: Akira Nishioka; Hitoshi Hirata, both of Tokyo, Japan

[73] Assignee: Pioneer Electronic Corporation, Tokyo, Japan

[21] Appl. No.: 513,788

[22] Filed: Jul. 15, 1983

Related U.S. Application Data

[63] Continuation of Ser. No. 232,065, Feb. 5, 1981.

[30] Foreign Application Priority Data

Feb. 6, 1980 [JP] Japan .................. 55-13272

[51] Int. Cl.³ .............................. H04H 5/00
[52] U.S. Cl. ..................... 381/15; 455/212; 455/222
[58] Field of Search .......... 307/360; 330/149; 381/15, 16; 455/194, 212, 221, 222, 224

[56] References Cited

U.S. PATENT DOCUMENTS

| | | | |
|---|---|---|---|
| 3,716,726 | 2/1973 | Trimble | 179/1 P |
| 4,038,604 | 7/1977 | Koerber | 455/212 X |
| 4,150,339 | 4/1979 | Sueyoshi et al. | 307/360 X |
| 4,159,396 | 6/1979 | Hilbert et al. | 179/1 GS |
| 4,178,552 | 12/1979 | Amazawa et al. | 455/224 |
| 4,245,348 | 1/1981 | Imazeki | 455/194 X |
| 4,292,552 | 9/1981 | Tanaka | 307/360 X |
| 4,326,297 | 4/1982 | Sato et al. | 455/222 |

FOREIGN PATENT DOCUMENTS 53-64411 6/1978 Japan .................. 455/222

Primary Examiner—Gene Z. Rubinson
Assistant Examiner—W. J. Brady
Attorney, Agent, or Firm—Sughrue, Mion, Zinn, Macpeak & Seas

[57] ABSTRACT

A muting circuit for an AM stereophonic receiver of the type that having a detector circuit operating upon an AM stereophonic signal, the carrier of which is phase-modulated by the difference signal of first and second stereo channel signals, for detecting the difference signal. The muting circuit includes a muting signal generating circuit for detecting the output level of the detector circuit exceeding a predetermined value and for generating a muting signal at least for periods when the predetermined value is exceeded, and a muting switch circuit for attenuating the output of the detector in response to the muting signal.

1 Claim, 5 Drawing Figures

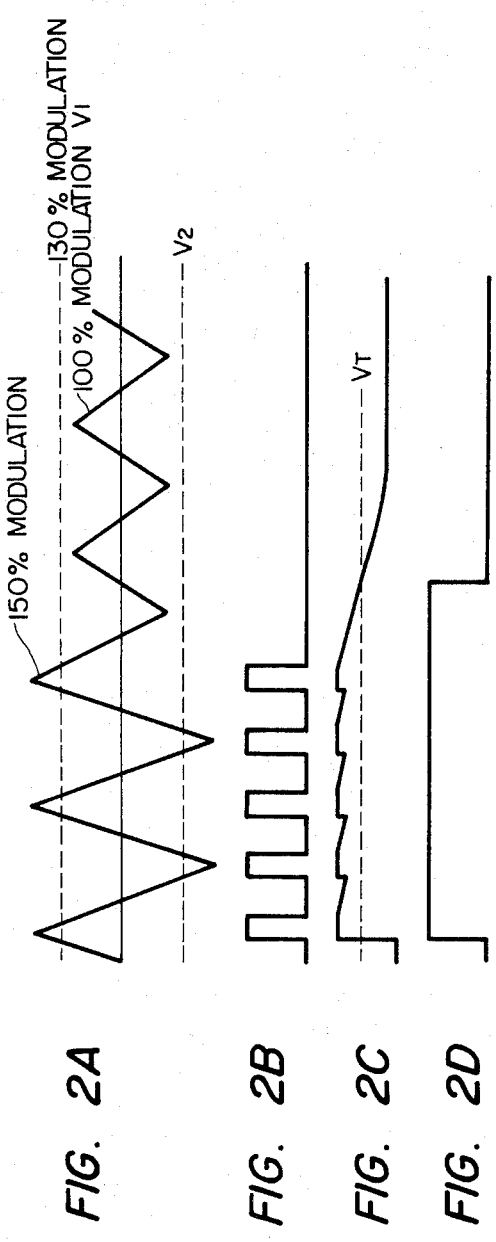

MUTING CIRCUIT FOR AM STEREOPHONIC RECEIVER

This application is a continuation of application Ser. No. 232,065, filed Feb. 5, 1981.

BACKGROUND OF THE INVENTION

The present inventon relates to a muting circuit for an AM stereophonic receiver. More particularly, the invention relates to a muting circuit for an AM stereophonic receiver which employs an AM stereophonic technique wherein the carrier wave is phase modulated by a sub signal or the difference signal of the two stereo channels.

Several techniques have been proposed for stereo-broadcasting in the AM radio frequencies. One of these is the AM/PM or AM/FM technique wherein a carrier signal is phase modulated by a sub signal (L−R) then amplitude-modulated by the main signal (L+R) for transmission. However, this technique is disadvantageous in that an interferring signal can phase-modulate the carrier signal with the percentage of modulation easily exceeding 100% and sometimes reaching as high as severl hundred percent. For example, in one AM/PM system, 100% modulation of the carrier signal by the sub signal corresponds to a phase angle of 1 radian (about 57 degrees). An interferring signal can easily shift the phase of the carrier signal by more than 57 degrees. Therefore, if an FM detector having "S-curve" characteristics is used to detect the sub carrier from such modulated signal, a rectangular pulse signal of a high level is produced which causes an audio output noise that is very unpleasant.

SUMMARY OF THE INVENTION

Accordingly, an object of the present invention is to provide a muting circuit for an AM stereophonic receiver that eliminates audible unpleasant noise from the detection output due to interference with an AM stereophonic carrier signal that has been phase-modulated by the sub signal.

In a muting circuit for an AM stereophonic receiver of the invention, the level of the output from a detection means that detects the sub signal in response to an AM stereophonic carrier signal which is phase-modulated by the sub signal is further detected. If the detected level exceeds a predetermined value, a muting signal is maintained ON at least for a time period during which the predetermined value is exceeded. The muting signal is used to attenuate the sub signal output.

BRIEF DESCRIPTION OF THE DRAWINGS

FIGS. 2A-2D are waveform diagrams for illustrating the operation of the circuit of FIG. 1.

DESCRIPTION OF THE PREFERRED EMBODIMENTS

Figure 1:
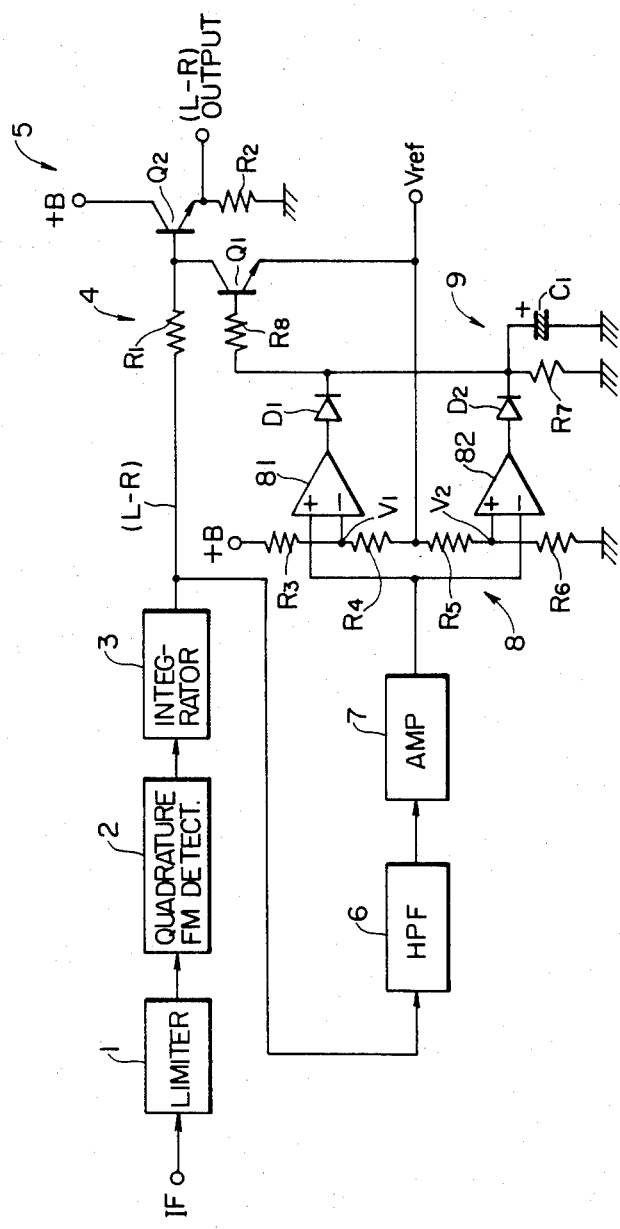
FIG. 1 is a circuit diagram of a preferred embodiment of a muting circuit of the invention.

FIG. 1 is a circuit diagram of a preferred embodiment of a muting circuit of the invention. An IF (intermediate frequency) signal that has been phase-modulated by the sub signal or the difference signal of the two stereo channels is supplied to a limiter 1 which eliminates a signal component that has been amplitude-modulated by the main signal. The IF signal is then supplied to a quadrature FM detector 2. The quadrature FM detector 2, the structure of which is well known, includes a 90° phase shifter that shifts the phase of the limiter output by 90 degrees and a phase comparator that makes a phase comparison between the output of the phase shifter and that of the limiter. The detector 2 has "S-curve" characteristics so as to provide an output level which varies with the frequency of the modulated signal. By integrating the output of the FM detector by an integrator 3, the sub signal, which is a phase-modulation component, is detected.

The detected sub signal output is supplied to a muting attenuator 4 composed of a resistor $R_1$ and a switching transistor $Q_1$ and then is supplied to a buffer circuit 5 which delivers the sub signal at the emitter follower of a transistor $Q_2$. In FIG. 1, $R_2$ represents an emitter resistor for the transistor $Q_2$.

The detection output is also supplied to a HPF (high-pass filter) 6 where the unwanted low-frequency component is removed then amplified to a required leel by an amplifier 7. The output signal of the amplifier 7 is coupled to a comparator circuit 8 for detecting the level of the amplified output. The comparator circuit 8 includes two comparators 81 and 82. The output of the amplifier 7 is supplied to the positive input of comparator 81 and to the negative input of comparator 82. To generate the reference voltage for each comparator, a voltage divider composed of series-connected resistors $R_3$–$R_6$ is connected between a voltage source $+B$ and ground. The junction between the resistors $R_4$ and $R_5$ is provided with a bias voltage $V_{ref}$. The resulting voltage $V_1$ at the junction between the resistors $R_3$ and $R_4$ is supplied to the negative input of the comparator 81 and the voltage $V_2$ at the junction between the resistors $R_5$ and $R_6$ is supplied to the positive input of the comparator 82. The outputs of the comparators 81 and 82 are coupled through diodes $D_1$ and $D_2$, respectively, to a smoothing circuit 9 composed of a resistor $R_7$ and a capacitor $C_1$. The output of the smoothing circuit, which is supplied to the muting circuit 4 through a resistor $R_8$, serves as a signal for controlling the base of the switching transistor $Q_1$.

FIGS. 2A-2D, taken together, as a waveform diagram for illustrating the operation of the circuit of FIG. 1. When an interfering signal enters the circuit with the amplitude of the interfering signal being significantly larger than that of the desired signal (the modulated AM stereophonic signal), if the angular frequency of the interfering signal is generally constant, the carrier signal of the modulated AM stereophonic signal is greatly phase-modulated by the interfering signal with the phase varying by a maximum of ±180 degrees depending upon the amplitude of the interfering signal. As represented in these waveforms, such variation occurs repeatedly at an interval of the angular frequency of the interfering signal. As a consequence, the detector 2 having S-curve characteristics delivers generally rectangular pulses having a frequency approximately equal to that of the interfering signal and at a level equal to that of the interfering signal. Thus, upon integrating these rectangular pulses by the integrator 3, a triangular waveform having the same frequency and a level proportional to that of the interfering signal is produced. This waveform is shown in FIG. 2A.

In the illustrated embodiment, the comparison voltages $V_1$ and $V_2$ of the comparator circuit 8 are preset at such values that the detector 2 detects the portions of the triangular waveform which exceed the peak level of the detection output when the percentage of phase modulation of the desired modulated AM stereophonic signal by the interfering wave reaches about 130%. In FIG. 2A, waveforms corresponding to 150% modulation and 100% modulation are depicted. For 150% modulation, the comparator circuit 8 delivers a high-level detection output only when the peak of 130% modulation is exceeded, as shown in FIG. 2B. In response thereto the smoothing circuit 9 produces an output which is shown in FIG. 2C. If the threshold voltage for the muting circuit 4 is $V_T$, the transistor $Q_1$ is held ON for a high-level period shown in FIG. 2D during which time it provides a low impedance. With the resistor $R_1$ having an adequately high resistance, satisfactory attenuation or muting of the detection output is realized. As discussed above, the muting circuit of the invention eliminates noise due to interfering signals and thereby provides a high-performance AM stereophonic receiver.

It is to be understood that the invention is not limited to the circuit configuration and the numerical values specified above and that various modifications are possible without departing from the split and scope of the invention. While the preceding description is directed to the AM/PM technique, the invention is also applicable to a stereophonic receiver using the AM/FM technique with similar results. In applying the invention to a receiver using the AM/FM technique, the detection output is not passed through an integrator and hence is in the form of a rectangular pulse signal rather than the triangular waveform shown in FIG. 2A. Nevertheless, similar results are obtained by detecting the level of such a rectangular pulse signal.

What is claimed is:

1. A sub-channel receiving circuit for an AM stereophonic receiver in which a subsignal is phase modulated onto a carrier signal, comprising;

a limiter having an input coupled to receive an IF signal;

an FM detector having an input coupled to an output of said limiter;

an integrator having an input coupled to an output of said FM detector;

a first resistor having a first terminal coupled to an output of said integrator;

a second resistor;

a first transistor having a base coupled to a second terminal of said first resistor, a collector coupled to a supply voltage terminal, and an emitter coupled through said second resistor to ground, an $L-R$ output signal being produced on said emitter of said first transistor;

a high-pass filter having an input coupled to said output of said integrator;

an amplifier having an input coupled to an output of said high-pass filter;

first and second comparators, said first comparator having a positive input terminal coupled to an output of said amplifier and said second comparator having a negative input terminal coupled to said output of said amplifier;

third through sixth resistors coupled in series with one another with a first terminal of said third resistor being coupled to said supply voltage terminal and a first terminal of said sixth resistor being connected to ground, a negative input of said first comparator being coupled to a junction point of said third and fourth resistors and a positive input of said second comparator being coupled to a junction point of said fifth and sixth resistors;

first and second diodes having anodes coupled, respectively, to outputs of said first and second comparators, and cathodes coupled together;

a seventh resistor coupled between said cathodes of said diodes and ground;

a capacitor coupled in parallel with said seventh resistor;

an eighth resistor; and a second transistor having a collector coupled to said base of said first transistor, an emitter coupled to a junction point of said fourth and fifth resistors and a base coupled through said eighth resistor to said cathodes of said diodes.

* * * * *